(12) United States Patent
Yamashita et al.

(10) Patent No.: US 12,490,522 B2
(45) Date of Patent: Dec. 2, 2025

(54) SOLAR CELL

(71) Applicants: KABUSHIKI KAISHA TOSHIBA, Tokyo (JP); Toshiba Energy Systems & Solutions Corporation, Kawasaki (JP)

(72) Inventors: Katsuya Yamashita, Kawasaki Kanagawa (JP); Yutaka Saita, Yokohama Kanagawa (JP); Tomohiro Tobari, Yokohama Kanagawa (JP); Miyuki Shiokawa, Kawasaki Kanagawa (JP)

(73) Assignees: Kabushiki Kaisha Toshiba, Kawasaki (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 18/178,649

(22) Filed: Mar. 6, 2023

(65) Prior Publication Data
US 2023/0207714 A1    Jun. 29, 2023

Related U.S. Application Data

(63) Continuation of application No. PCT/JP2020/034852, filed on Sep. 15, 2020.

(51) Int. Cl.
*H10F 19/80* (2025.01)
*H10F 19/70* (2025.01)
*H10F 77/169* (2025.01)

(52) U.S. Cl.
CPC ............. *H10F 19/80* (2025.01); *H10F 19/70* (2025.01); *H10F 77/1698* (2025.01)

(58) Field of Classification Search
CPC ..... H01L 31/048; H01L 31/044; H10F 19/80; H10F 19/70; H10F 77/1698
See application file for complete search history.

(56) References Cited

U.S. PATENT DOCUMENTS 4,746,618 A * 5/1988 Nath .................. H01L 31/0463
136/258
6,316,832 B1    11/2001 Tsuzuki et al.
(Continued)

FOREIGN PATENT DOCUMENTS

JP    H11-150286 A    6/1999
JP    2002-246628 A   8/2002
(Continued)

OTHER PUBLICATIONS

European Patent Office, Extended European Search Report in EP App. No. 20954044.2, 6 pages (Jun. 4, 2024).
(Continued)

*Primary Examiner* — Sadie White
(74) *Attorney, Agent, or Firm* — Finnegan, Henderson, Farabow, Garrett & Dunner, LLP

(57) ABSTRACT

A solar cell according to an embodiment includes at least one first solar cell panel, a flexible substrate, a bypass diode, and a package. The at least one first solar cell panel is disposed with a light receiving surface thereof oriented in a predetermined direction. The flexible substrate is disposed in the vicinity of the at least one first solar cell panel when viewed in the predetermined direction. The flexible substrate forms a bypass line for the at least one first solar cell panel. The bypass diode is mounted on the flexible substrate and is connected to the at least one first solar cell panel in parallel. The package houses the at least one first solar cell panel, the flexible substrate, and the bypass diode. The at least one first solar cell panel is disposed between both ends of the flexible substrate and the bypass diode in the predetermined direction.

12 Claims, 6 Drawing Sheets

(56) References Cited

U.S. PATENT DOCUMENTS

| | | | |
|---|---|---|---|
| 6,353,175 B1* | 3/2002 | Fraas | H01L 31/0504 257/431 |
| 6,613,603 B1* | 9/2003 | Sano | H01L 31/076 427/205 |
| 2003/0062078 A1* | 4/2003 | Mimura | H01L 31/044 136/244 |
| 2009/0044852 A1* | 2/2009 | Shadbolt | H01L 31/044 136/251 |
| 2010/0116325 A1* | 5/2010 | Nikoonahad | H02J 3/381 136/251 |
| 2010/0146878 A1* | 6/2010 | Koch | H01L 31/048 52/173.3 |
| 2010/0147364 A1* | 6/2010 | Gonzalez | H10F 19/70 136/251 |
| 2011/0108084 A1 | 5/2011 | Tisler et al. | |
| 2012/0060895 A1* | 3/2012 | Rubin | H10F 19/902 136/246 |
| 2013/0092231 A1* | 4/2013 | Kung | H02S 30/10 136/259 |
| 2013/0206203 A1* | 8/2013 | Lommasson | H10F 19/902 438/59 |
| 2014/0124014 A1* | 5/2014 | Morad | H01L 31/0508 136/246 |
| 2016/0099363 A1* | 4/2016 | Whetsel | H10F 19/70 136/246 |
| 2018/0083151 A1 | 3/2018 | Shibasaki et al. | |
| 2018/0315874 A1* | 11/2018 | Hosken | H02S 50/00 |

FOREIGN PATENT DOCUMENTS

| | | |
|---|---|---|
| JP | 2011-192890 A | 9/2011 |
| JP | 2017-517145 A | 6/2017 |
| JP | 2018-157176 A | 10/2018 |
| JP | 3220083 U | 2/2019 |
| WO | WO 2015/183827 A2 | 12/2015 |
| WO | WO 2015/183827 A3 | 12/2015 |

OTHER PUBLICATIONS

Japanese Patent Office, Decision to Grant a Patent in JP App. No. 2022-550061, 3 pages, with machine translation, 2 pages (Jul. 30, 2024).

* cited by examiner

SOLAR CELL

CROSS-REFERENCE TO RELATED APPLICATION

This is a Continuation Application of International Application No. PCT/JP2020/034852, filed on Sep. 15, 2020, and the entire contents of the aforementioned application are incorporated herein by reference.

FIELD

Embodiments of the present invention relate to a solar cell.

BACKGROUND

In general, a bypass line is connected to a solar cell panel, in which a photovoltaic cell is formed, as a bypass for a current. For example, a bypass line includes a bypass diode disposed in a junction box and a bus bar connecting a solar cell panel and a bypass diode to each other. However, installing a bypass line may hinder weight reduction of the entire system.

In addition, in a configuration in which a solar cell panel is housed in a package, if the thickness of the package is reduced in order to reduce the weight of the entire system, unevenness may occur on the front and back surfaces of the package due to a peripheral structure of the solar cell panel. For example, if unevenness occurs on a light incidence surface of the front and back surfaces of the package, the amount of light incident on the solar cell panel may decrease, resulting in a decrease in power generation efficiency.

DETAILED DESCRIPTION

A solar cell according to an embodiment includes at least one first solar cell panel, a flexible substrate, a bypass diode, and a package. The at least one first solar cell panel is disposed with a light receiving surface thereof oriented in a predetermined direction. The flexible substrate is disposed in the vicinity of the at least one first solar cell panel when viewed in the predetermined direction. The flexible substrate forms a bypass line for the at least one first solar cell panel. The bypass diode is mounted on the flexible substrate and is connected to the at least one first solar cell panel in parallel. The package houses the at least one first solar cell panel, the flexible substrate, and the bypass diode. The at least one first solar cell panel is disposed between both ends of the flexible substrate and the bypass diode in the predetermined direction.

Hereinafter, a solar cell of embodiments will be described with reference to the drawings. In the following description, the same reference signs are given to constituent elements having the same or similar functions. Further, duplicate description of those constituent elements may be omitted.

Figure 1:
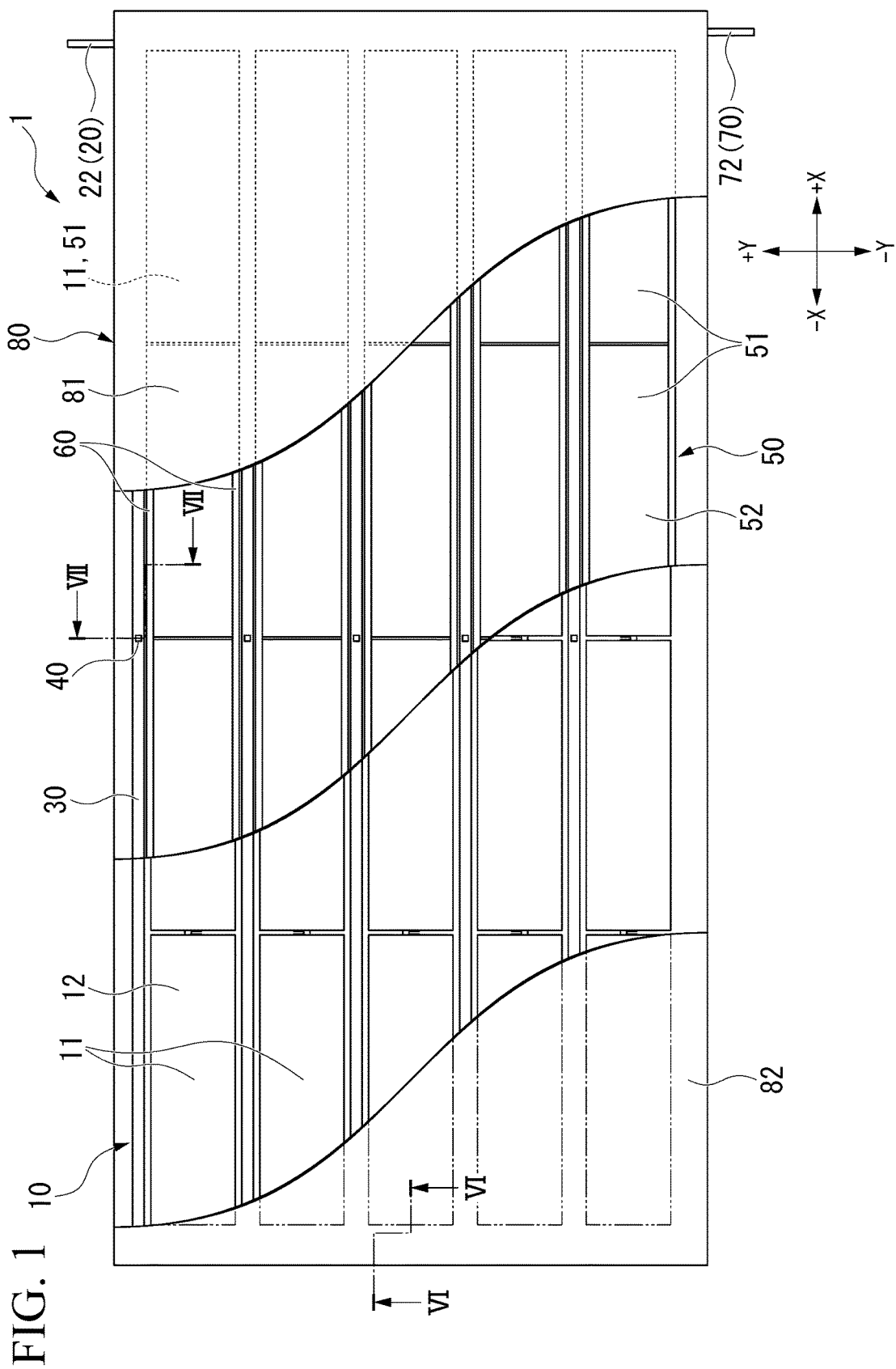
FIG. 1 is a plan view showing a layer structure of a tandem type solar cell according to an embodiment.

FIG. 1 is a plan view showing a layer structure of a tandem type solar cell according to an embodiment. In FIG. 1, in order to show a stacked structure of the tandem type solar cell 1, some layers are cut away.

As shown in FIG. 1, the tandem type solar cell 1 is formed in a rectangular plate shape. Hereinafter, a thickness direction of the tandem type solar cell 1 is simply referred to as a "thickness direction." Here, for convenience of explanation, a +X direction, -X direction, +Y direction, and -Y direction orthogonal to the thickness direction will be defined. The -X direction is a direction opposite to the +X direction. In a case where the +X direction and the -X direction are not distinguished from each other, they are simply referred to as an "X direction." The +Y direction and the -Y direction are directions orthogonal to the X direction. The -Y direction is a direction opposite to the +Y direction. In a case where the +Y direction and the -Y direction are not distinguished from each other, they are simply referred to as a "Y direction." In addition, one direction in the thickness direction is defined as a "front side," and a direction opposite to the front side is defined as a "back side."

The tandem type solar cell 1 includes a bottom module 10 having a photovoltaic cell 12 that constitutes a back cell, a top module 50 having a photovoltaic cell 52 that is disposed on the front side of the bottom module 10 and constitutes a front cell, and a package 80 that houses the bottom module 10 and the top module 50. The bottom module 10 and the top module 50 are connected to each other in series.

Figure 2:
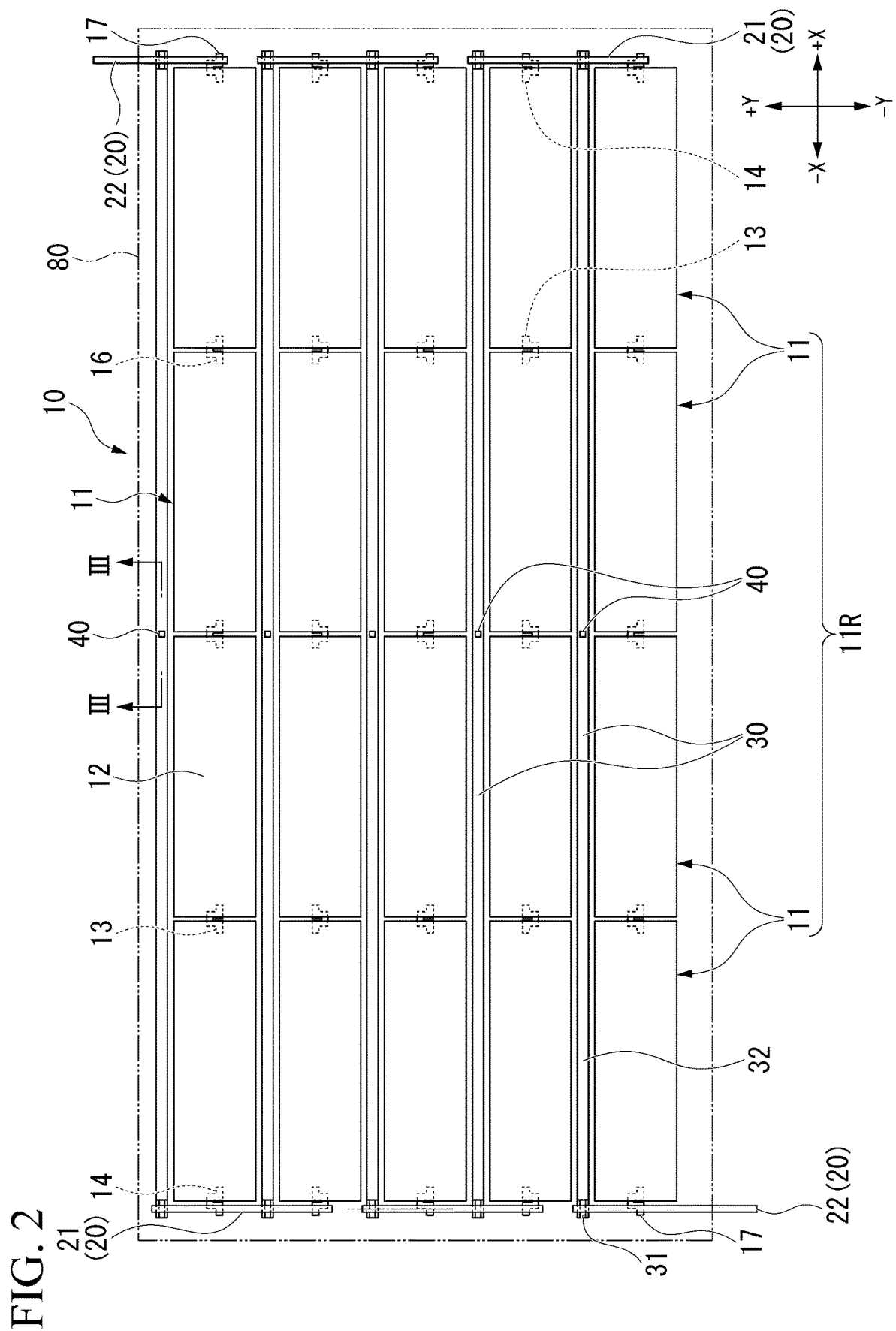
FIG. 2 is a plan view showing a bottom module of the embodiment.

FIG. 2 is a plan view showing the bottom module of the embodiment. In FIG. 2, the outer shape of the package 80 is indicated by an imaginary line.

As shown in FIG. 2, the bottom module 10 includes a plurality of bottom solar cell panels 11 (first solar cell panels, other solar cell panels) connected to each other in series. All the bottom solar cell panels 11 are disposed along a common XY plane. At least one photovoltaic cell 12 is formed in the bottom solar cell panel 11. A single photovoltaic cell 12 may be formed in the bottom solar cell panel 11, or a plurality of photovoltaic cells 12 connected to each other in series and parallel may be formed in the bottom solar cell panel 11. For example, the photovoltaic cell 12 is a silicon-based photovoltaic cell 12 using Si for a light absorbing layer. The photovoltaic cell 12 is a back-contact type photovoltaic cell 12 having an n-type electrode and a p-type electrode on the back side of the light absorbing layer. The bottom solar cell panel 11 is disposed with a light receiving surface thereof oriented to the front side. That is, a normal direction of the light receiving surface of the bottom solar cell panel 11 is the thickness direction. Each bottom solar cell panel 11 is formed in a rectangular shape with a pair of sides extending in the X direction and the remaining pair of sides extending in the Y direction in a plan view. In the present embodiment, each bottom solar cell panel 11 is formed in a rectangular shape with the X direction as a longitudinal direction in a plan view.

The bottom module 10 includes a plurality of bottom panel rows 11R (at least one first solar cell panel) each formed by a plurality of bottom solar cell panels 11 connected to each other in series. In each bottom panel row 11R, the bottom solar cell panels 11 are arranged in the X direction at intervals. The outer shape of the entire bottom panel row 11R is formed in a rectangular shape with the X direction as a longitudinal direction in a plan view. The bottom panel rows 11R are arranged in the Y direction at intervals. As a result, the plurality of bottom solar cell panels 11 are aligned in the X direction and the Y direction. The outer shape of the entire plurality of aligned bottom solar cell panels 11 is formed in a rectangular shape with the X direction as a longitudinal direction. In the illustrated example, the bottom module 10 includes five bottom panel rows 11R each formed by four bottom solar cell panels 11. However, the number of bottom solar cell panels 11 is not particularly limited. Hereinafter, with reference to the bottom panel row 11R positioned furthest in the +Y direction among the plurality of bottom panel rows 11R, the bottom panel row 11R located at an N-th position in the –Y direction is referred to as an "N-th bottom panel row 11R." The same applies to a top panel row 51R, which will be described later.

The bottom solar cell panel 11 includes a negative electrode terminal 13 electrically connected to the n-type electrode and a positive electrode terminal 14 electrically connected to the p-type electrode. The negative electrode terminal 13 and the positive electrode terminal 14 are provided on the back surface of the bottom solar cell panel 11. The negative electrode terminal 13 is provided at an end portion of the bottom solar cell panel 11 in an odd-numbered bottom panel row 11R in the +X direction and is provided at an end portion of the bottom solar cell panel 11 in an even-numbered bottom panel row 11R in the –X direction. The positive electrode terminal 14 is provided at an end portion of each bottom solar cell panel 11 on a side opposite to the negative electrode terminal 13.

The bottom module 10 includes an interconnector 16, a panel row end connector 17, and a bottom bus bar 20.

The interconnector 16 connects adjacent bottom solar cell panels 11 in the bottom panel row 11R to each other in series. The interconnector 16 is formed of a metal plate. For example, the interconnector 16 is formed of a copper plate having solder plated layers on both main surfaces. The interconnector 16 extends across a space between a pair of bottom solar cell panels 11 adjacent in the X direction in a plan view. The interconnector 16 is connected to the negative electrode terminal 13 of one bottom solar cell panel 11 and the positive electrode terminal 14 of the other bottom solar cell panel 11.

The panel row end connector 17 is connected to a terminal that is not connected to the interconnector 16 among the negative electrode terminal 13 and the positive electrode terminal 14 of the bottom solar cell panel 11 of each bottom panel row 11R. That is, the panel row end connector 17 is connected to the negative electrode terminal 13 and the positive electrode terminal 14, which are the electrical end portions of the bottom panel row 11R. The panel row end connector 17 is formed of a metal plate. For example, the panel row end connector 17 is formed of the same material as the interconnector 16. The panel row end connector 17 protrudes in the X direction from the bottom panel row 11R in a plan view.

The bottom bus bar 20 is disposed in the vicinity of the entire plurality of bottom solar cell panels 11 in a plan view. In the present embodiment, the vicinity of the entire plurality of bottom solar cell panels 11 is the vicinity of a single rectangular panel in a case where the plurality of bottom solar cell panels 11 are regarded as the single rectangular panel. The bottom bus bar 20 is formed of a metal plate. For example, the bottom bus bar 20 is formed of a copper plate having solder plated layers on both main surfaces. The bottom bus bar 20 extends in the Y direction. The bottom bus bars 20 are disposed not to come into contact with each other. The bottom bus bar 20 includes an inter-panel bus bar 21 and a terminal bus bar 22.

The inter-panel bus bar 21 connects the adjacent bottom panel rows 11R to each other in series via the panel row end connectors 17. The inter-panel bus bars 21 are disposed on both sides of the bottom panel row 11R in the +X direction and the –X direction in a plan view. The inter-panel bus bar 21 in the +X direction connects an n-th bottom panel row 11R and an (n+1)-th bottom panel row 11R to each other in series, where n is an even number. Specifically, the inter-panel bus bar 21 in the +X direction is connected to the panel row end connector 17 in the +X direction connected to the n-th bottom panel row 11R and the panel row end connector 17 in the +X direction connected to the (n+1)-th bottom panel row 11R. The inter-panel bus bar 21 in the –X direction connects an m-th bottom panel row 11R and an (m+1)-th bottom panel row 11R to each other in series, where m is an odd number. Specifically, the inter-panel bus bar 21 in the –X direction is connected to the panel row end connector 17 in the –X direction connected to the m-th bottom panel row 11R and the panel row end connector 17 in the –X direction connected to the (m+1)-th bottom panel row 11R.

The terminal bus bar 22 is connected to the panel row end connector 17 that is not connected to the inter-panel bus bar 21 among the panel row end connectors 17. That is, when a plurality of bottom solar cell panels 11 connected to each other in series are regarded as one solar cell, the terminal bus bar 22 is connected to the negative electrode terminal 13 and the positive electrode terminal 14, which are the electrical end portions of the one solar cell, via the panel row end connector 17. The terminal bus bars 22 are disposed on both sides of the bottom panel row 11R in the +X direction and the –X direction in a plan view. The terminal bus bar 22 in the +X direction is connected to the panel row end connector 17 in the +X direction connected to a first bottom panel row 11R. The terminal bus bar 22 in the +X direction extends in the +Y direction from a connecting portion with the panel row end connector 17 and is drawn out of the package 80. In a case where the number of bottom panel rows 11R is N, the terminal bus bar 22 in the –X direction is connected to the panel row end connector 17 in the –X direction connected to an N-th bottom panel row 11R. The terminal bus bar 22 in the –X direction extends in the –Y direction from a connecting portion with the panel row end connector 17 and is drawn out of the package 80.

The bottom bus bar 20 extends in the +Y direction with respect to each bottom panel row 11R connected to the bottom bus bar 20. For example, the inter-panel bus bar 21 in the +X direction extends in the +Y direction with respect to an m-th bottom panel row 11R from a connecting portion with the m-th bottom panel row 11R and is connected to an (m–1)-th bottom panel row 11R, where m is an odd number. Further, the inter-panel bus bar 21 in the +X direction extends in the +Y direction with respect to the (m–1)-th bottom panel row 11R from a connecting portion with the (m–1)-th bottom panel row 11R. The bottom bus bar 20 is connected to a flexible substrate 30 at a portion located in the +Y direction with respect to each bottom panel row 11R connected to the bottom bus bar 20.

The bottom module 10 includes the flexible substrate 30 and a bypass diode 40. The flexible substrate 30 is provided for each bottom panel row 11R. The flexible substrate 30 is connected to the bottom panel row 11R in parallel to form a bypass line for the bottom panel row 11R. The flexible substrate 30 is connected to the negative electrode terminal 13 and the positive electrode terminal 14, which are the electrical end portions of the bottom panel row 11R, via the bottom bus bars 20 and the panel row end connectors 17. The flexible substrate 30 is disposed in the vicinity of the bottom panel row 11R not to overlap the bottom solar cell panel 11 in a plan view. The flexible substrate 30 extends in the longitudinal direction (that is, the X direction) of the bottom panel row 11R with a constant width in a plan view. The flexible board 30 is disposed along the bottom panel row 11R at a position in the +Y direction of the bottom panel row 11R connected to the flexible substrate 30 in parallel. The flexible substrates 30 other than a first flexible substrate 30 are disposed between the adjacent bottom panel rows 11R in a plan view.

The flexible substrate 30 is disposed with both main surfaces oriented in the thickness direction. The flexible substrate 30 includes a wiring 31 and a base member 32 that supports the wiring 31. For example, the wiring 31 is formed of a copper foil or the like. The wiring 31 extends over substantially the entire length of the flexible substrate 30. The base member 32 is formed of an insulation material such as polyimide in a sheet shape. The base member 32 is formed to cover both sides of the wiring 31 except for both end portions of the flexible substrate 30 and a mounting portion 33 which will be described later. The base member 32 exposes the wiring 31 to the front side at both end portions of the flexible substrate 30. The wiring 31 is exposed to the front side from the base member 32 at both end portions of the flexible substrate 30. The wiring 31 is connected to the back surface of the bottom bus bar 20 at both end portions of the flexible substrate 30.

Figure 3:
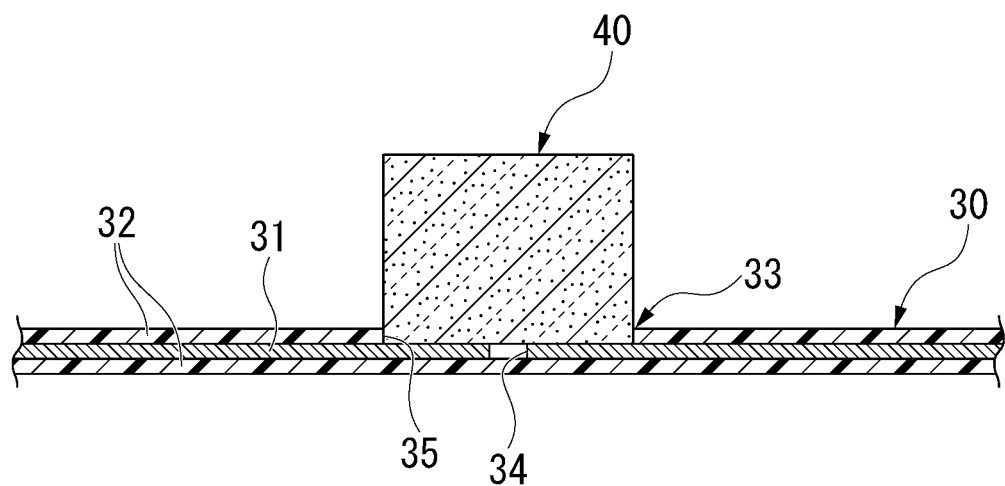
FIG. 3 is a cross-sectional view along line of FIG. 2.

FIG. 3 is a cross-sectional view along line of FIG. 2.

As shown in FIG. 3, the flexible substrate 30 has a mounting portion 33. The mounting portion 33 is a portion on which the bypass diode 40 is mounted. The mounting portion 33 includes a dividing portion 34 formed in the wiring 31 and a window portion 35 formed in the base member 32 and exposing the wiring 31. The dividing portion 34 insulates both portions of the wiring 31 with the dividing portion 34 interposed therebetween from each other. The dividing portion 34 is formed by etching, for example. The window portion 35 exposes both portions of the wiring 31 with the dividing portion 34 interposed therebetween to the front side. The window portion 35 exposes both portions of the wiring 31 with the dividing portion 34 interposed therebetween together. However, the window portion may expose both portions of the wiring 31 with the dividing portion 34 interposed therebetween separately.

The bypass diode 40 is disposed on an inner side of the window portion 35. The bypass diode 40 is connected to both portions of the wiring 31 with the dividing portion 34 interposed therebetween. The bypass diode 40 performs rectification in the wiring 31. The bypass diode 40 protrudes from the flexible substrate 30 to the front side.

Figure 4:
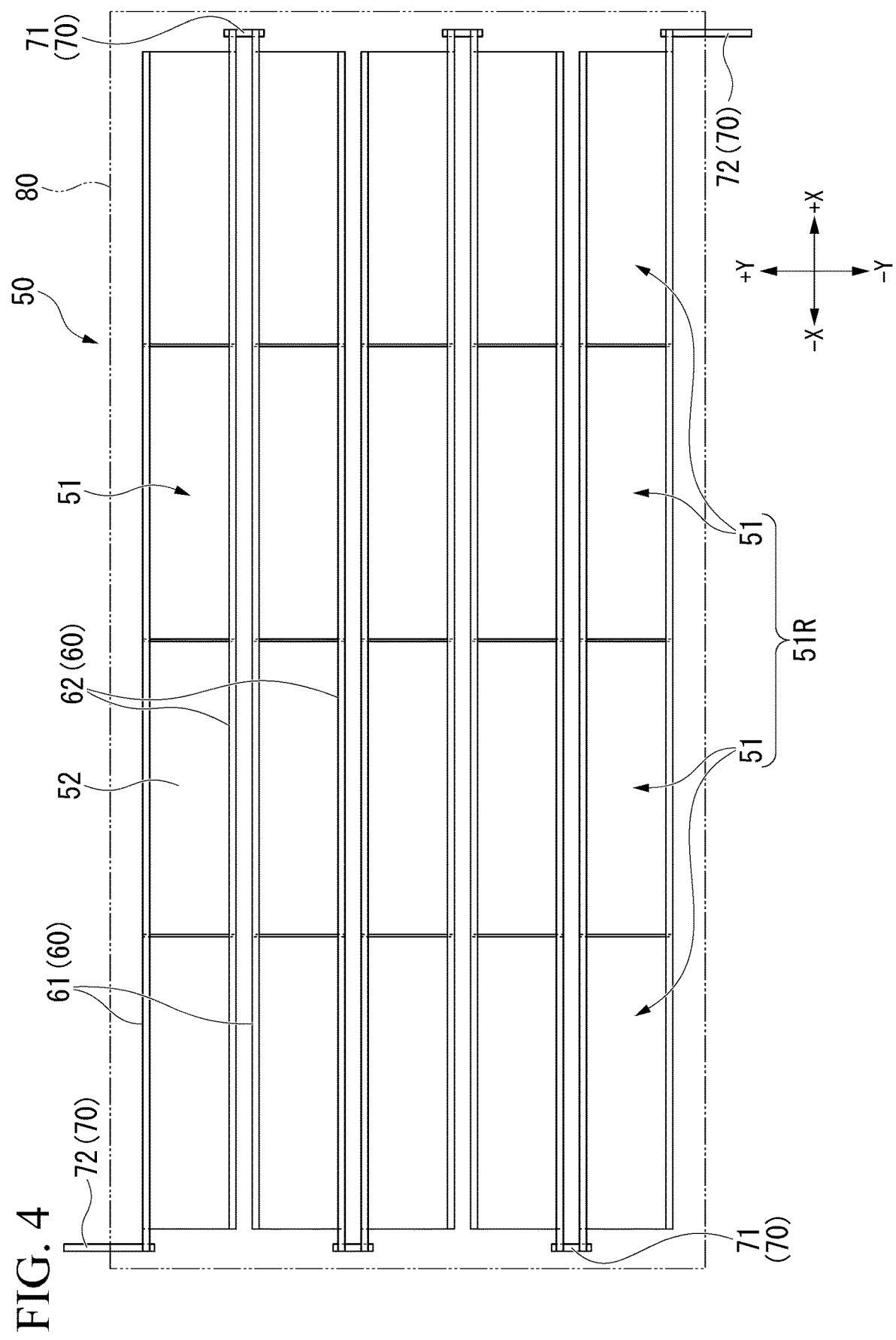
FIG. 4 is a plan view showing a top module of the embodiment.

FIG. 4 is a plan view showing the top module of the embodiment. In FIG. 4, the outer shape of the package 80 is indicated by an imaginary line.

As shown in FIG. 4, the top module 50 has a plurality of top solar cell panels 51 (second solar cell panels). All the top solar cell panels 51 are disposed along a common XY plane. The top solar cell panels 51 are provided in the same number as the bottom solar cell panels 11. One photovoltaic cell 52 is formed in the top solar cell panel 51. However, a plurality of photovoltaic cells connected to each other in series and parallel may be formed in the top solar cell panel 51. The photovoltaic cell 52 is a transmission type photovoltaic cell. The photovoltaic cell 52 has a light absorbing layer with a wider bandgap than the light absorbing layer of the photovoltaic cell 12 of the bottom module 10. For example, the light absorbing layer of the photovoltaic cell 52 contains $Cu_2O$. For example, the photovoltaic cell 52 has a configuration in which a p-electrode, a p-$Cu_2O$ layer, an n-compound layer, and an n-electrode are stacked in that order on the front side of a glass substrate. The p-electrode is exposed on the front side at an end portion of the top solar cell panel 51 in the +Y direction. The n-electrode is exposed on the front side at an end portion of the top solar cell panel 51 in the −Y direction. The p-electrode and n-electrode function as terminals for taking out a current on the front side surface of the top solar cell panel 51. The top solar cell panel 51 is disposed with a light receiving surface thereof oriented to the front side. That is, a normal direction of the light receiving surface of the top solar cell panel 51 is the thickness direction.

The top module 50 includes a plurality of top panel rows 51R each formed by a plurality of top solar cell panels 51 connected to each other in parallel. In each top panel row 51R, the top solar cell panels 51 are arranged in the X direction at intervals. The outer shape of the entire top panel row 51R is formed in a rectangular shape with the X direction as a longitudinal direction in a plan view. The top panel rows 51R are connected to each other in series. The top panel rows 51R are arranged in the Y direction at intervals. As a result, the plurality of top solar cell panels 51 are aligned in the X direction and the Y direction. The outer shape of the entire plurality of aligned top solar cell panels 51 is formed in a rectangular shape with the X direction as a longitudinal direction. The top solar cell panels 51 are disposed to overlap the bottom solar cell panels 11 one by one. As a result, in the illustrated example, the top module 50 includes five top panel rows 51R each formed by four top solar cell panels 51.

Figure 5:
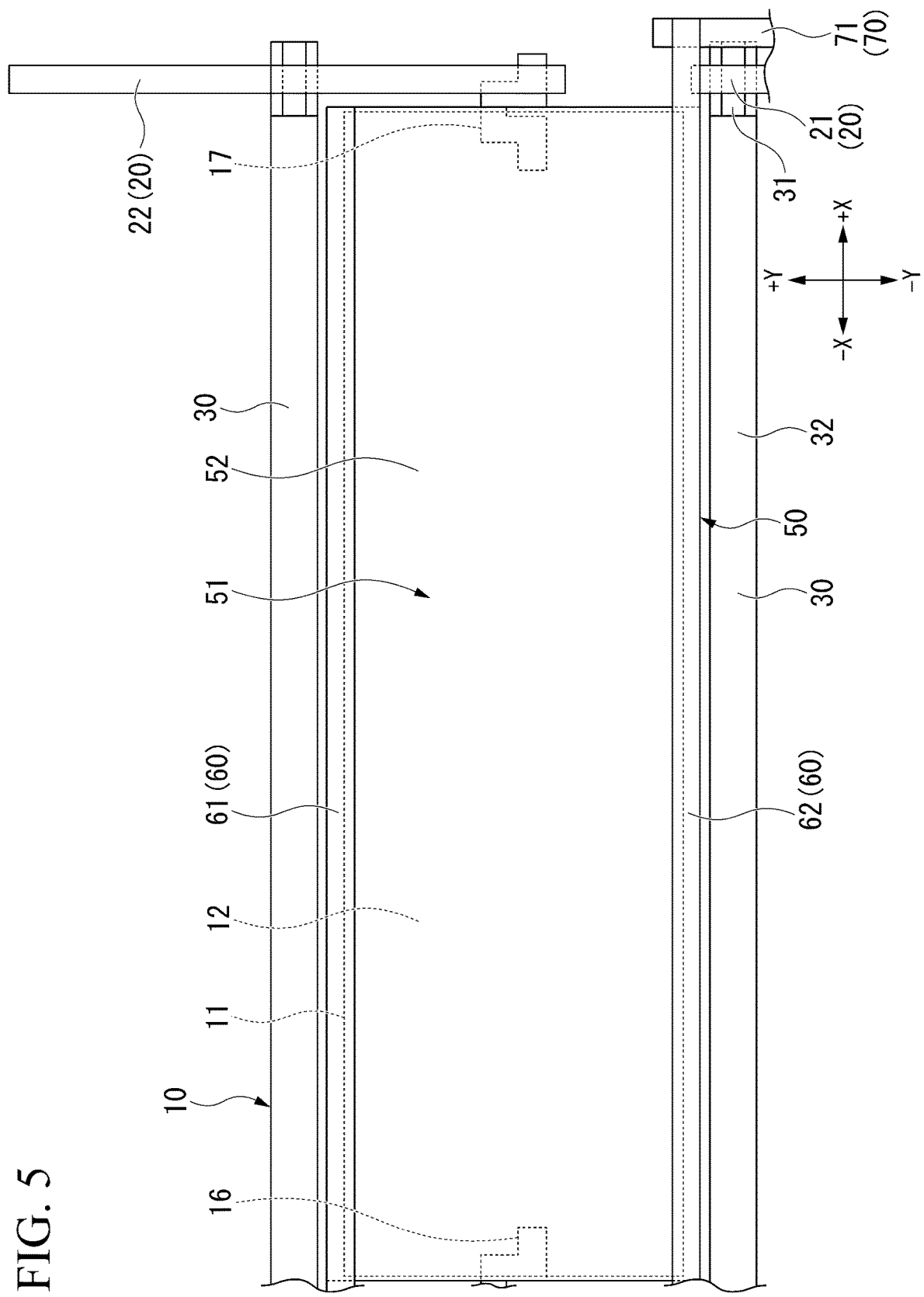
FIG. 5 is a plan view showing a positional relationship between the bottom module and the top module of the embodiment.

FIG. 5 is a plan view showing a positional relationship between the bottom module and the top module of the embodiment.

As shown in FIG. 5, each top solar cell panel 51 is stacked at a position facing the light receiving surface (the front side surface) of the bottom solar cell panel 11 of the bottom module 10. The top solar cell panel 51 is formed to have a size equal to or greater than that of the bottom solar cell panel 11. The top solar cell panel 51 overlaps the entire bottom solar cell panel 11 in a plan view. The photovoltaic cell 52 of the top solar cell panel 51 overlaps the entire photovoltaic cell 12 of the bottom solar cell panel 11 in a plan view. In other words, the entire photovoltaic cell 12 of the bottom solar cell panel 11 is disposed inside the outline of the photovoltaic cell 52 of the top solar cell panel 51 in a plan view.

As shown in FIG. 4, the top module 50 includes a conductive tape 60 and a top bus bar 70. A pair of conductive tapes 60 are provided for each top panel row 51R. The conductive tape 60 includes a first conductive tape 61 conducted to the p-electrode of the top solar cell panel 51 and a second conductive tape 62 conducted to the n-electrode of the top solar cell panel 51 for each top panel row 51R. Each conductive tape 60 extends in an alignment direction (that is, the X direction) of the top solar cell panels 51 in the top panel row 51R with a constant width in a plan view. The first conductive tape 61 is attached to the surface of an end portion of the top solar cell panel 51 of each top panel row 51R in the +Y direction. The first conductive tape 61 connects the p-electrodes of the top solar cell panels 51 of each top panel row 51R in common. The second conductive tape 62 is attached to the surface of an end portion of the top solar cell panel 51 of each top panel row 51R in the −Y direction. The second conductive tape 62 connects the n-electrodes of the top solar cell panels 51 of each top panel row 51R in common. The conductive tape 60 is desirably disposed not to overlap the photovoltaic cell 12 of the bottom solar cell panel 11 in a plan view.

The conductive tape 60 extends in the +X direction or the −X direction with respect to the top panel row 51R. The first conductive tape 61 attached to an odd-numbered top panel row 51R extends in the −X direction with respect to the top panel row 51R. The first conductive tape 61 attached to an even-numbered top panel row 51R extends in the +X direction with respect to the top panel row 51R. The second conductive tape 62 attached to an odd-numbered top panel row 51R extends in the +X direction with respect to the top panel row 51R. The second conductive tape 62 attached to an even-numbered top panel row 51R extends in the −X direction with respect to the top panel row 51R. The conductive tape 60 is connected to the top bus bar 70 at a portion that protrudes in the X direction with respect to the top panel row 51R.

The top bus bars 70 are disposed on both sides of the top panel row 51R in the +X direction and the −X direction in a plan view. The top bus bar 70 is disposed in the vicinity of the entire plurality of top solar cell panels 51 in a plan view. In the present embodiment, the vicinity of the entire plurality of top solar cell panels 51 is the vicinity of a single rectangular panel in a case where the plurality of top solar cell panels 51 are regarded as the single rectangular panel. The top bus bar 70 is disposed outside the bottom bus bar 20 in the X direction. The top bus bar 70 is formed of a metal plate. For example, the top bus bar 70 is formed of the same material as the bottom bus bar 20. The top bus bar 70 extends in the Y direction. The top bus bars 70 are disposed not to come into contact with each other. The top bus bar 70 includes an inter-panel bus bar 71 and a terminal bus bar 72.

The inter-panel bus bar 71 connects the adjacent top panel rows 51R to each other in series via the conductive tape 60. The inter-panel bus bars 71 are disposed on both sides of the top panel row 51R in the +X direction and the −X direction in a plan view. The inter-panel bus bar 71 in the +X direction is connected to an end portion of the second conductive tape 62 in the +X direction connected to an m-th top panel row 51R and an end portion of the first conductive tape 61 in the +X direction connected to an (m+1)-th top panel row 51R, where m is an odd number. The inter-panel bus bar 71 in the −X direction is connected to an end portion of the second conductive tape 62 in the −X direction connected to the n-th top panel row 51R and an end portion of the first conductive tape 61 in the −X direction connected to an (n+1)-th top panel row 51R, where n is an even number.

When a plurality of top solar cell panels 51 connected to each other in series and parallel are regarded as one solar cell, the terminal bus bar 72 is connected to the p-electrode and the n-electrode, which are the electrical end portions of the one solar cell, via the conductive tape 60. The terminal bus bars 72 are disposed on both sides of the top panel row 51R in the +X direction and the −X direction in a plan view. The terminal bus bar 72 in the −X direction is connected to an end portion of the first conductive tape 61 in the −X direction connected to a first top panel row 51R. The terminal bus bar 72 in the −X direction extends in the +Y direction from a connecting portion with the first conductive tape 61 and is drawn out of the package 80. In a case where the number of top panel rows 51R is N, the terminal bus bar 72 in the +X direction is connected to an end portion of the second conductive tape 62 in the +X direction connected to an N-th top panel row 51R. The terminal bus bar 72 in the +X direction extends in the −Y direction from a connecting portion with the second conductive tape 62 and is drawn out of the package 80.

Figure 6:
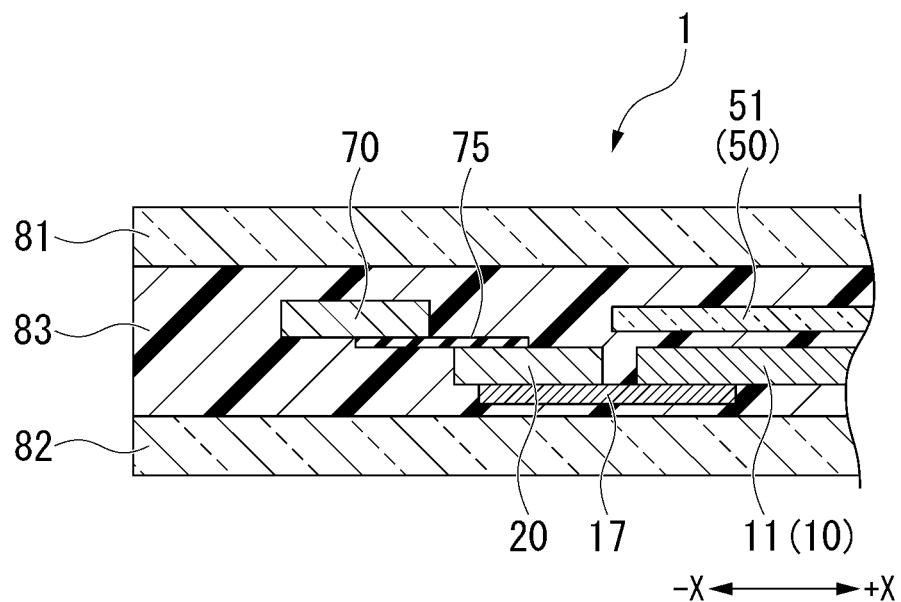
FIG. 6 is a cross-sectional view along line VI-VI of FIG. 1.

FIG. 6 is a cross-sectional view along line VI-VI of FIG. 1.

As shown in FIG. 6, the bottom bus bar 20 and the top bus bar 70 are fixed to each other by an insulation tape 75. The insulation tape 75 is attached to the bottom bus bar 20 and the top bus bar 70, for example, in a region where the existence of the bottom bus bar 20 and the existence of the top bus bar 70 overlap each other in the Y direction.

As shown in FIG. 1, the package 80 houses the bottom module 10 with the terminal bus bar 22 of the bottom bus bar 20 drawn out and houses the top module 50 with the terminal bus bar 72 of the top bus bar 70 drawn out. The package 80 includes a front cover 81 and a back cover 82. The front cover 81 is disposed on the front side of bottom module 10 and the top module 50. The back cover 82 is disposed on the back side of bottom module 10 and the top module 50.

The front cover 81 is a plate member formed of a transparent resin material, glass, or the like. The front cover 81 is formed in a rectangular shape with a pair of sides extending in the X direction and the remaining pair of sides extending in the Y direction in a plan view. The front cover 81 is disposed to overlap all of a portion of the bottom module 10 excluding a tip end of the terminal bus bar 22 and a portion of the top module 50 excluding a tip end of the terminal bus bar 72 in a plan view. The front side surface of the front cover 81 forms a light incidence surface of the tandem type solar cell 1.

The back cover 82 is a plate member formed of a resin material, glass, or the like. The back cover 82 is formed to have the same shape and size as the front cover 81 in a plan view. The back cover 82 is disposed to completely overlap the front cover 81 in a plan view.

Figure 7:
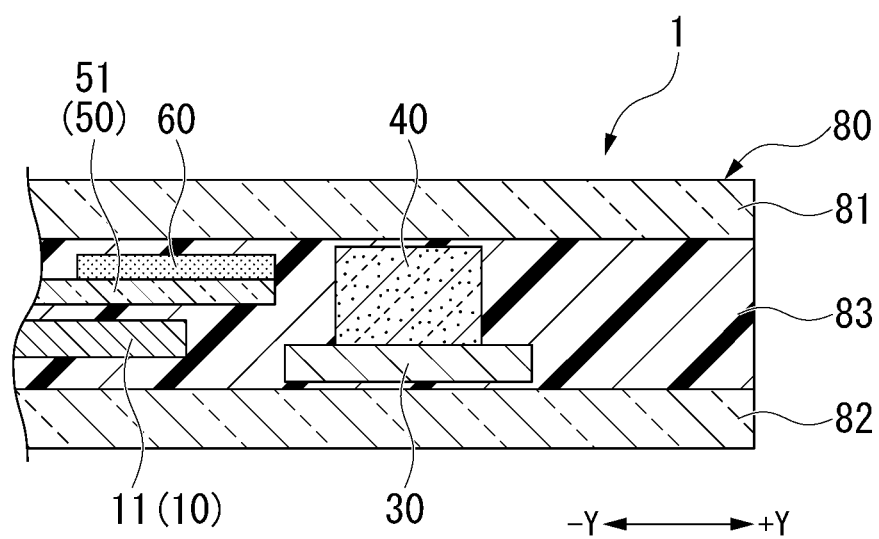
FIG. 7 is a cross-sectional view along line VII-VII of FIG. 1.

FIG. 7 is a cross-sectional view along line VII-VII of FIG. 1.

As shown in FIG. 7, the package 80 has a sealing member 83. The sealing member 83 is disposed between the front cover 81 and the back cover 82. The sealing member 83 is formed of a transparent resin material. The sealing member 83 is formed by stacking insulation films between the front cover 81 and the back cover 82. The bottom module 10 and the top module 50 are disposed between layers of the insulation films. The bottom solar cell panel 11 and the top solar cell panel 51 are disposed at least between different layers of the insulation films.

The positional relationship between the bottom module 10 and the top module 50 in the thickness direction will be described in detail.

All the bottom solar cell panels 11 and all the top solar cell panels 51 are disposed between both ends of the bypass diodes 40 and flexible substrate 30 in the thickness direction. However, it also includes the case where the positions of the end portions of the bottom solar cell panel 11 and the top solar cell panel 51 match the positions of the end portions of the bypass diode 40 and the flexible substrate 30 in the thickness direction. In the illustrated example, the back side end portion (the back surface) of the bottom solar cell panel 11 is located on the front side with respect to the back side end portion (the back surface) of the flexible substrate 30. The front side end portion (the front side surface) of the top solar cell panel 51 is located on the back side with respect to the front side end portion of the bypass diode 40.

As described above, the tandem type solar cell 1 of the present embodiment includes the flexible substrate 30 on which the bypass diode 40 is mounted to form the bypass line for the bottom panel row 11R of the bottom solar cell panel 11. According to this configuration, it is possible to omit the arrangement of the bypass diode in a junction box and the installation of a bus bar for connecting the solar cell panel and the junction box to each other. Therefore, the weight of the tandem type solar cell 1 can be reduced.

Further, the width and thickness of the wiring 31 of the flexible substrate 30 can be set according to the performance of the photovoltaic cell 12. Therefore, it is possible to prevent the tandem type solar cell 1 from increasing in size by forming the flexible substrate 30 in an appropriate size.

Furthermore, in the present embodiment, the bottom panel row 11R of the bottom module 10 and the top panel row 51R of the top solar cell panel 51 of the top module 50 are disposed between both ends of the flexible substrate 30 and the bypass diode 40 in the thickness direction. As a result, it is possible to prevent the member constituted by the flexible substrate 30 and the bypass diode 40 from protruding greatly to the front side or the back side from the bottom panel row 11R and the top panel row 51R even if the bypass diode 40 protrudes greatly from the flexible substrate 30. Therefore, it is possible to reduce the weight of the tandem solar cell 1 by reducing the thickness thereof while curbing the occurrence of unevenness on the light incidence surface of the tandem type solar cell 1.

Further, the bypass diode 40 is disposed between the bottom panel rows 11R adjacent in the Y direction when viewed in the thickness direction. Thereby, the bypass diode 40 is disposed at a position closer to the center than to the outer periphery of the bottom module 10. Therefore, the bypass diodes 40 are dispersedly disposed in the bottom module 10 compared to the case where the bypass diodes are disposed in the vicinity of the entire plurality of bottom panel rows 11R. Therefore, the thickness of the tandem type solar cell 1 can be made more uniform.

The bottom panel row 11R is disposed along the flexible substrate 30. According to this configuration, when the bottom panel row 11R and the flexible substrate 30 are disposed in the package 80, one of the bottom panel row 11R and the flexible substrate 30 is disposed before the other, and thus it is possible to position the other. Therefore, the productivity of the tandem type solar cell 1 can be improved.

The flexible substrate 30 extends in the longitudinal direction (the X direction) of the bottom panel row 11R. Therefore, most of the bypass lines of the bottom panel row 11R are formed by the flexible substrate 30. Therefore, the weight of the tandem type solar cell 1 can be reduced.

In the above embodiment, all the bottom solar cell panels 11 are connected to each other in series, but the present invention is not limited to this. The plurality of bottom solar cell panels may be connected to each other in parallel or in a combination of series and parallel. Further, the bottom module may be provided with a single bottom solar cell panel.

Further, in the above embodiment, the top solar cell panels 51 are connected to each other in 4-parallel and 5-series, but the present invention is not limited to this. All the top solar cell panels 51 may be connected to each other in parallel or in series.

Further, in the above embodiment, the tandem type solar cell in which the bottom solar cell panel 11 and the top solar cell panel 51 are stacked is adopted as an example of a solar cell in the claims. However, the solar cell may be one in which solar cell panels are not stacked. For example, only a module which is the same as the bottom module 10 of the embodiment may be a solar cell housed in a package. Even in this case, as long as the solar cell panel is disposed between both ends of the flexible substrate and the bypass diode in the thickness direction, the above effects can be exhibited.

Further, in the above embodiment, the flexible substrate 30 is connected to the bottom panel row 11R via the inter-panel bus bar 21 connected to the panel row end connector 17. However, the flexible substrate may be directly connected to the panel row end connector 17 or may be directly connected to the bottom panel row 11R.

Further, in the above embodiment, no bypass line is formed in the top solar cell panel 51, but like the bottom module 10, a bypass line may be formed in the top solar cell panel 51 using the flexible substrate and the bypass diode. For example, a bypass line that commonly bypasses the top solar cell panel 51 of each top panel row 51R may be formed for each top panel row 51R. For example, a bypass line that bypasses all the top solar cell panels 51 may be formed. In either case, the bottom solar cell panel 11 of the bottom module 10 and the top solar cell panel 51 of the top module 50 are desirably disposed between both ends of the flexible substrate and the bypass diode in the thickness direction.

Further, in the above embodiment, the bypass diode 40 is mounted on the front side surface of the flexible substrate 30. However, the bypass diode may be mounted on the back surface of the flexible substrate. Even in this case, as long as the solar cell panel is disposed between both ends of the flexible substrate and the bypass diode in the thickness direction, the above effects can be exhibited. It is more preferable to mount the bypass diode 40 on the back surface of the flexible substrate 30 in order to curb the unevenness of the light incidence surface.

According to at least one embodiment described above, the tandem type solar cell includes the flexible substrate on which the bypass diode is mounted to form the bypass line for the bottom solar cell panel. According to this configuration, it is possible to omit the arrangement of the bypass diode in a junction box and the installation of a bus bar for connecting the solar cell panel and the junction box to each other. Therefore, the weight of the tandem type solar cell can be reduced. Furthermore, the bottom solar cell panel is disposed between both ends of the flexible substrate and the bypass diode in the thickness direction. As a result, it is possible to prevent the member constituted by the flexible substrate and the bypass diode from protruding greatly to the front side or the back side from the bottom solar cell panel even if the bypass diode protrudes greatly from the flexible substrate. Therefore, it is possible to reduce the weight of the tandem solar cell by reducing the thickness thereof while curbing the occurrence of unevenness on the light incidence surface of the tandem type solar cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
    at least one first solar cell panel that is disposed with a light receiving surface thereof oriented in a predetermined direction;
    a flexible substrate that is disposed in the vicinity of the at least one first solar cell panel when viewed in the predetermined direction to form a bypass line for the at least one first solar cell panel, the bypass line is connected to the at least one first solar cell panel in parallel to form a bypass for a current of the at least one first solar cell panel;
    a bypass diode that is mounted on the flexible substrate and is connected to the at least one first solar cell panel in parallel;
    a second solar cell panel that is stacked on the at least one first solar cell panel; and
    a package that houses the at least one first solar cell panel, the second solar cell panel, the flexible substrate, and the bypass diode,
    wherein
        one of the at least one first solar panel and the second solar panel comprises a back-contact type photovoltaic cell,
        the other of the at least one first solar panel and the second solar panel comprises a transmission type photovoltaic cell, and is stacked at a position facing the light receiving surface of the one of the at least one first solar panel and the second solar panel,
        the package comprises a sealing member formed by stacking insulation films,
        the at least one first solar panel and the second solar panel are disposed at least between different layers of the insulation films, and
        the at least one first solar cell panel and the second solar cell panel are disposed between a first end of the flexible substrate opposite the bypass diode and a second end of the bypass diode opposite the first end of the flexible substrate in the predetermined direction.

2. The solar cell according to claim 1, further comprising:
    at least one other solar cell panel that is disposed side by side with the at least one first solar cell panel in a first direction orthogonal to the predetermined direction and is connected to the at least one first solar cell panel in series,
    wherein the at least one other solar cell panel is disposed between the first end of the flexible substrate and the second end of the bypass diode in the predetermined direction.

3. The solar cell according to claim 2, wherein the bypass diode is disposed between the at least one first solar cell panel and the at least one other solar cell panel when viewed in the predetermined direction.

4. The solar cell according to claim 1, wherein the at least one first solar cell panel is disposed along the flexible substrate.

5. The solar cell according to claim 4, wherein the flexible substrate extends in a longitudinal direction of all the at least one first solar cell panel.

6. The solar cell according to claim 1, wherein the bypass diode is mounted on a back side surface of the flexible substrate when viewed in the predetermined direction.

7. The solar cell according to claim 1, wherein the package comprises the sealing member that is formed to cover the flexible substrate and the bypass diode.

8. The solar cell according to claim 1, wherein the flexible substrate comprises a base member that is formed of an insulation material in a sheet shape and a wiring that is supported by the base member.

9. The solar cell according to claim 7, wherein the flexible substrate comprises a base member that is formed of an insulation material in a sheet shape and a wiring that is supported by the base member.

10. The solar cell according to claim 3, wherein the at least one first solar cell panel comprises a plurality of first solar cell panels that are connected to each other in series,
    the plurality of first solar cell panels form a first panel row and are arranged in a second direction orthogonal to the first direction when viewed in the predetermined direction in the first panel row,
    the at least one other solar cell panel comprises a plurality of other solar cell panels that are connected to each other in series,
    the plurality of other solar cell panels form a second panel row that is connected to the first panel row in series and are arranged in the second direction in the second panel row, and
    the bypass diode is disposed between the first panel row and the second panel row when viewed in the predetermined direction.

11. The solar cell according to claim 2, wherein the at least one first solar cell panel comprises a plurality of first solar cell panels that are connected to each other in series,
    the plurality of first solar cell panels form a first panel row and are arranged in a second direction orthogonal to the predetermined direction and the first direction in the first panel row,
    the at least one other solar cell panel comprises a plurality of other solar cell panels that are connected to each other in series,
    the plurality of other solar cell panels form a second panel row that is connected to the first panel row in series and are arranged in the second direction in the second panel row,
    the bypass diode is connected in parallel with the first panel row,
    the flexible substrate on which the bypass diode is mounted comprises a wiring that forms the bypass line of the first panel row, and
    the wiring is disposed between the first panel row and second panel row in the first direction and extends along the second direction and is parallel to the first panel row and second panel row.

12. The solar cell according to claim 2, wherein the at least one first solar cell panel comprises a plurality of first solar cell panels that are connected to each other in series,
    the plurality of first solar cell panels form a first panel row and are arranged in a second direction orthogonal to the predetermined direction and the first direction in the first panel row,
    the at least one other solar cell panel comprises a plurality of other solar cell panels that are connected to each other in series,
    the plurality of other solar cell panels form a second panel row that is connected to the first panel row in series and are arranged in the second direction in the second panel row,
    the bypass diode is connected in parallel with the first panel row,
    the flexible substrate on which the bypass diode is mounted comprises a wiring that forms the bypass line of the first panel row, and the wiring and the bypass diode are disposed between the first panel row and second panel row in each of the first and second directions.

\* \* \* \* \*